United States Patent [19]

Audaire et al.

[11] 4,305,011

[45] Dec. 8, 1981

[54] REFERENCE VOLTAGE GENERATOR

[75] Inventors: Luc Audaire, Voiron; Bernard Baylac; Gerard Merckel, both of Sassenage, all of France

[73] Assignee: Commissariat a l'Energie Atomique, Paris, France

[21] Appl. No.: 111,278

[22] Filed: Jan. 11, 1980

[30] Foreign Application Priority Data

Jan. 26, 1979 [FR] France ................................ 79 02052

[51] Int. Cl.³ ........................ H03K 3/353; H03K 3/01; H01L 27/02
[52] U.S. Cl. .................................... 307/304; 307/297; 357/41
[58] Field of Search ................... 307/297, 304; 357/41

[56] References Cited

U.S. PATENT DOCUMENTS

| | | | |
|---|---|---|---|
| 3,806,742 | 4/1974 | Powell | 307/297 |
| 3,975,648 | 8/1976 | Tobey et al. | 307/297 |
| 4,096,430 | 6/1978 | Waldron | 307/297 |
| 4,100,437 | 7/1978 | Hoff | 307/297 |

*Primary Examiner*—Gene M. Munson

[57] ABSTRACT

A reference voltage generator comprising two MOS-type transistors $T_1'$ and $T_2'$ produced on the same substrate, the channels of these transistors having the respective lengths $L_1$ and $L_2$ and the respective widths $Z_1$ and $Z_2$, one of the transistors $T_2'$ having a channel, only one dimension of which is of the same order of magnitude as the corresponding dimension of the extension, relative to the source and drain of this transistor, of the space charge zone appearing round this source and this drain when the transistor is operating, the other dimension being large in relation to the corresponding dimension of said extension of the space charge zone, the other transistor $T_1'$ having a channel the two dimensions of which are large in relation to the corresponding dimensions of the extension, relative to the source and drain of this transistor, of the space charge zone appearing round this source and drain when the transistor is operating, and further comprising means for providing the difference in the threshold voltages of the transistors $T_1'$ and $T_2'$, this difference in threshold voltages representing the reference voltage.

9 Claims, 7 Drawing Figures

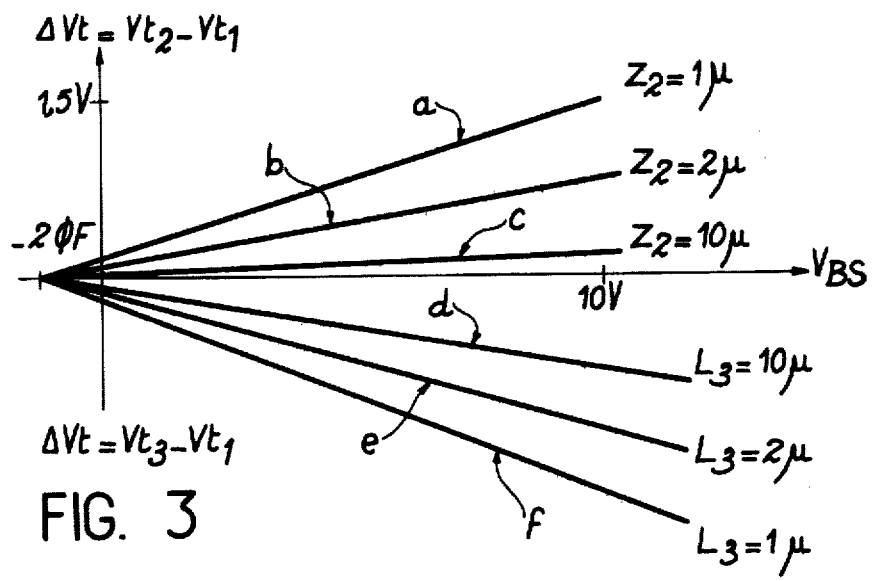
FIG. 3
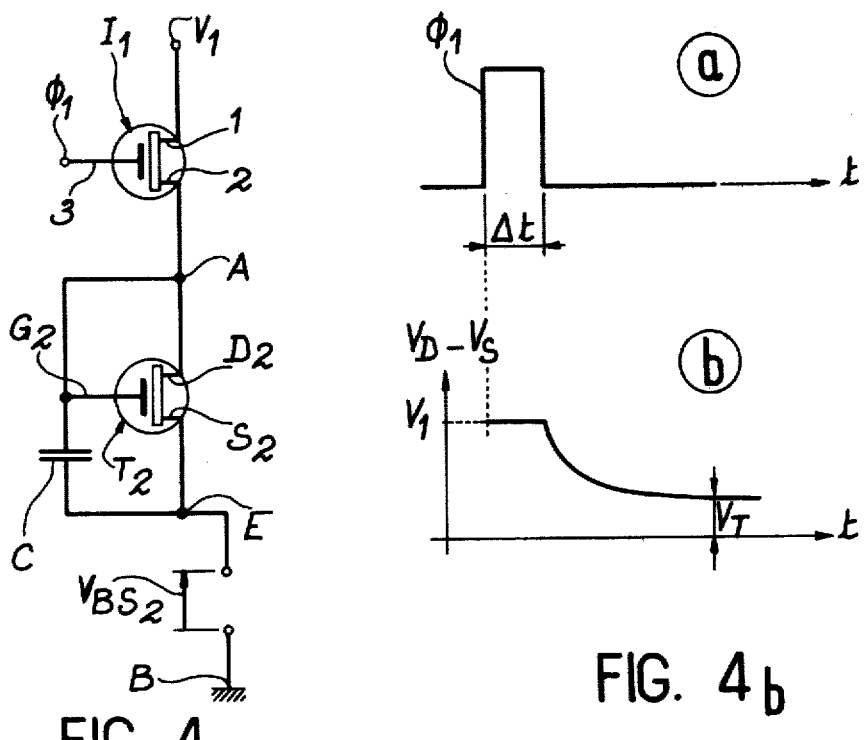
FIG. 4a
FIG. 4b

{ #4,305,011 }

REFERENCE VOLTAGE GENERATOR

BACKGROUND OF THE INVENTION

The present invention relates to a reference voltage generator.

This generator is intended for supplying large-scale integrated circuits in which a large number of components are assembled. This generator may be used, for example, as a reference voltage circuit in digital-to-analog or analog-to-digital converters in which the stability of the voltage determines the quality of the conversion. The integration of the reference generator on the part which constitutes the converter reduces the cost of the latter whilst increasing its reliability.

A reference voltage generator is known, comprising a diode of inverse polarity, controlling the grid of a large transistor polarised in the operating zone referred to as "low inversion," with an exponential characteristic. This type of generator has the disadvantage of having very high operational impedances; the currents which it supplies are very weak, even for high voltages, its stability is poor and it is very sensitive to the surrounding electromagnetic fields.

Another known generator comprises two large MOS transistors, one being of the enriched type whilst the other is impoverished or depleted, produced by ion implantation, for example, and associated with means for measuring the difference between the threshold voltages of the transistors. With this generator, the main disadvantage is the fact that the threshold voltage is not technologically reproducible. The voltage reference therefore has to be adjusted after manufacture. Moreover, the means for measuring the difference in the threshold voltages are generally differential amplifiers which are sensitive to technological uncertainties in the threshold voltage.

In the technique of integrated circuits of the MIS type (metal-insulator-semiconductor), the reference voltage is generally supplied by potentiometric dividing bridges between two supply voltages. These dividing bridges consist of series of MOS transistors with which slight variations in supply voltages, scattering of threshold voltages inherent in the production of the circuits, variations in threshold voltages linked to the variations in the operating temperatures of the circuit and, finally, variations in threshold voltages connected with the ageing of the structure of the circuit can be compensated.

However, these dividing bridges consisting of MOS transistors cannot act on all these parameters at the same time and can only provide compensation for slight variations in these parameters.

BRIEF SUMMARY OF THE INVENTION

The aim of the present invention is to remedy these disadvantages and, in particular, to provide a reference generator which has low operational impedance, is not very sensitive to the electromagnetic environment and is capable of delivering a reference voltage without the need to make adjustments after manufacture. Finally, the invention sets out to provide a generator having very great stability as a function of the temperature and the various operational parameters of the circuits.

The invention relates to a reference voltage generator, characterised in that it comprises two transistors $T_1'$ and $T_2'$ of the MOS type, produced on the same substrate, the channels of these transistors having the lengths $L_1$ and $L_2$, respectively, and the widths $Z_1$ and $Z_2$, respectively, one of the transistors $T_2'$ having a channel, one single dimension of which is of the same order of magnitude as the corresponding dimension of the extension, in relation to the source and drain of this transistor, of the space charge zone appearing round this source and this drain when the transistor is functioning, the other dimension being large in relation to the corresponding dimension of said extension of the space charge zone, the other transistor $T_1'$ having a channel both dimensions of which are large in relation to the corresponding dimensions of the extension, in relation to the source and the drain of this transistor, of the space charge zone appearing round this source and this drain when the transistor is functioning, and characterised in that it comprises means for providing the difference between the threshold voltage of the transistors $T_1'$ and $T_2'$, this difference in threshold voltages representing the reference voltage.

According to another feature of the invention, the reference voltage generator comprises means for fixing the substrate-source voltage of the transistors $T_1'$ and $T_2'$, the sources of which are connected to a common point.

According to another feature, the means for providing the difference between the threshold voltages of the transistors $T_1'$ and $T_2'$ comprise means for measuring the difference in the respective grid-source voltages of the transistors $T_1'$ and $T_2'$.

According to an advantageous feature of the invention, the means for measuring the difference in the respective grid-source voltages of transistors $T_1'$ and $T_2'$ comprise a capacitor whose two terminals are respectively connected to a first point which is common to the grid and the drain of the transistor $T_2'$ and to a second point which is common to the grid and the drain of the transistor $T_1'$, via two charging and discharging control switches, the first and second common points being connected to a direct voltage source, via two connecting switches, respectively, so that when the two charging and discharging switches and the two connecting switches are closed, each of the plates of the capacitor is charged to the potential of the source, then, when the connecting switches are open and the charging and discharging control switches are closed, the plates of the capacitor discharge into the transistors $T_1'$ and $T_2'$ until the difference in potential available at the terminals of this capacitor is equal to the difference in threshold of the transistors $T_1'$ and $T_2'$.

According to another feature of the generator of the invention, the difference in the threshold voltages of the transistors $T_1'$ and $T_2'$ is available at the terminals of the capacitor via two output switches, respectively, which are closed after the charge and discharge control switches are opened, when the difference in potential at the terminals of the capacitor is equal to the difference in the threshold voltages of the transistors $T_1'$ and $T_2'$.

According to an advantageous feature, the charge and discharge switches, the connecting switches and the output switches are MOS transistors the grids of which are connected to control means for making the charge and discharge control transistors and the connecting switches conductive, for a sufficient time to enable the plates of the capacitor to be charged to the potential of the source, then for blocking the connecting transistors so that the plates of the capacitor are discharged into the transistors $T_2'$ and $T_1'$ until the difference in potential at its terminals is equal to the difference in the threshold voltages of the transistors $T_2'$ and $T_1'$, then for making the output transistors conductive when this difference in threshold voltages is attained, this voltage being available between the sources of these output transistors whose drains are connected to the terminals of the capacitor, whilst the drains of the transistors $T_2'$ and $T_1'$ are connected, respectively, to the drains of the charging and discharging transistors whose sources are connected to said direct voltage source.

BRIEF DESCRIPTION OF THE DRAWINGS

Further features and advantages of the invention will become apparent from the following description, which is given solely by way of an illustration, with reference to the accompanying drawings, wherein:

FIG. 3 is a diagram representing the differences in threshold voltages between two of the transistors in FIG. 1, when the source-substrate voltage applied to these transistors varies, and for different dimensions of these transistors;

FIG. 4a schematically shows a circuit for measuring the threshold voltage of an MOS transistor;

FIG. 4b is a diagram representing a control signal appearing in the circuit of FIG. 4a;

DETAILED DESCRIPTION OF THE PREFERRED EMBODIMENTS

Figure 1:
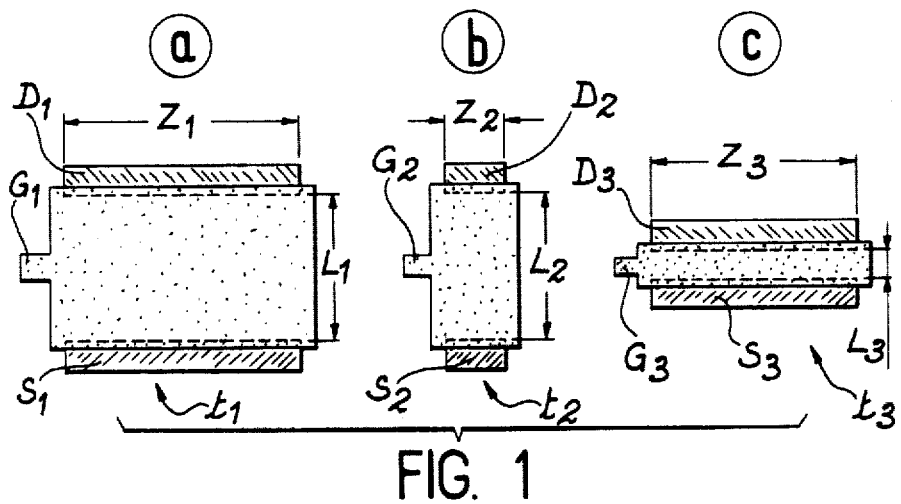
FIG. 1 schematically shows three transistors $t_1$, $t_2$, $t_3$ of the MOS type, of different dimensions, produced on the same substrate.

With reference to FIG. 1, this shows three MOS-type transistors $t_1$, $t_2$, $t_3$ produced on the same substrate but shown separately in the drawing. $G_1$, $G_2$, $G_3$ denote the respective grids of these transistors, whilst $D_1$, $D_2$, $D_3$ denote the respective drains and $S_1$, $S_2$, $S_3$, respectively, denote the sources. $L_1$, $L_2$, $L_3$ are the lengths of the channels of the transistors $t_1$, $t_2$, $t_3$, whereas $Z_1$, $Z_2$, $Z_3$, respectively, denote the widths of these channels. It is obvious that the transistors shown in this figure are MOS transistors, either of the type with a "P channel" or of the type with an "N channel." Let us suppose, for example, that the dimensions of the transistor $t_1$ are such that $Z_1$ and $L_1$ are greater than 30μ. In the same way, for $t_2$, we will suppose that $Z_2$ is less than 5μ and that $L_2$ is greater than 30μ. Finally, for the transistor $t_3$, $Z_3$ is greater than 30μ and $L_3$ is less than 5μ.

Figure 2A:
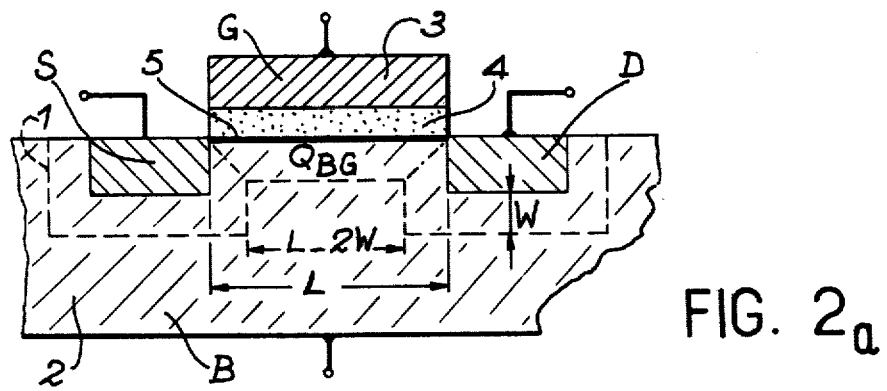
FIG. 2a shows this transistor in longitudinal section, in the direction of the length L of the channel.

With reference to FIG. 2a, this shows a more detailed view of one of the transistors in FIG. 1, in schematic section along the length L of the channel, so as to show the influence of the channel length on the threshold voltage $V_t$ of the transistor. In this figure, S, G, D and B, respectively, denote the source, grid, drain and substrate of the MOS transistor shown. The extension of the space charge zone, of thickness W, is delimited by the broken line 1, whose position depends on the value of the voltage $V_{BS}$ applied between the substrate B and the source S of the transistor. The substrate B may be of the P type or N type, and the electrical neutrality is kept in the volume, away from the surface. The grid G is made up, in known manner, of a layer 3 of aluminum, deposited on an insulating layer 4. The inversion channel 5 is formed as soon as the voltage applied between the grid and the source is greater than the threshold voltage $V_t$ of the transistor. The threshold voltage is given by the known equation:

$$V_T + V_{FB} + 2\phi_F + \frac{Q_{BG}}{C_{ox}ZL}$$

In this equation, $V_{FB}$ denotes the flat band voltage, $\phi_F$ denotes the Fermi potential of the substrate, $Q_{BG}$ denotes the space charge controlled for the grid electrode, Cox denotes the capacity of this electrode per unit of surface, and Z and L, respectively, denote the width and length of the channel of the transistor.

The charge $Q_{BG}$ of the substrate is proportional to the doping of the substrate and to the volume of the space charge controlled by the grid electrode.

For a large transistor, this volume is equal to the product WZL, where W denotes the thickness of the space charge zone. In this case, the threshold voltage is independent of the dimensions L and Z of the transistor.

For a transistor whose channel is short and wide, the volume of the space charge is equal to $$WZL\left(1 - \frac{W}{L}\right).$$

This means that its threshold voltage is less than that of a large transistor. This effect is amplified by an increase in the polarisation between the source and the substrate, which produces an increase in the extension W of the space charge.

Figure 2B:
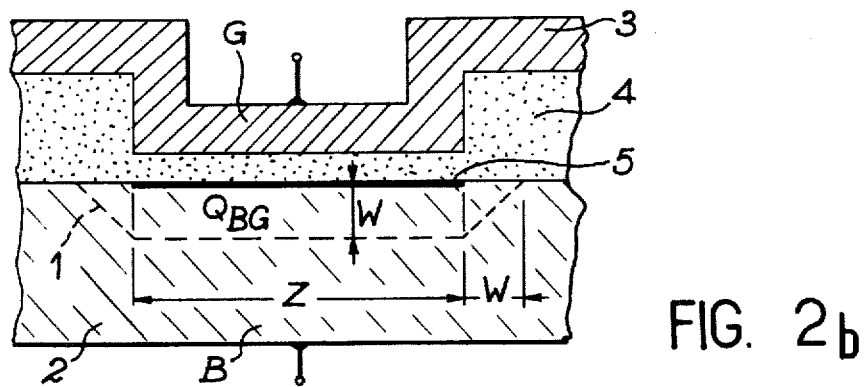
FIG. 2b shows this transistor in lateral section in the direction of the width Z of the channel.

With reference to FIG. 2b, this shows a section, in the lateral direction, through a transistor with a narrow channel. In this case, assuming that the channel is long, the volume of the space charge is equal to $$WZL\left(1 + \frac{W}{Z}\right).$$

The result of this is that the threshold voltage of the transistor is greater than that of a large transistor. This effect is also amplified if the polarisation between the source and the substrate is increased.

The geometric effects on the threshold voltage become negligible when the dimensions L and Z of the transistor are large in relation to the extension W of the space charge zone, i.e. when L and Z > 30μ.

FIG. 3 is a diagram representing the differences in threshold voltage of two transistors in FIG. 1, when the substrate-source voltage $V_{BS}$ varies and when these transistors have different dimensions. In this diagram, the voltage $V_{BS}$ is given on the x-axis, whilst on the y-axis is shown the difference in the threshold voltages $\Delta V_t = V_{t2} - V_{t1}$, between the threshold voltages of the transistors $t_2$ and $t_1$, or the difference in threshold voltages $\Delta V_t = V_{t3} - V_{t1}$, between the threshold voltages of the trasistors $t_3$ and $t_1$. In general, this difference in threshold voltage $\Delta V_t$ is expressed by the approximate equation:

$$\Delta V_t = (V_{BS} - 2\phi_F)\left(\frac{\alpha_1}{Z} - \frac{\alpha_2}{L}\right).$$

In this equation, $\alpha_1$ and $\alpha_2$ denote coefficients of proportionality, Z and L denote the width and length of the channel of the MOS transistor in question, $V_{BS}$ denotes the substrate-source voltage applied to this transistor, and $\phi_F$ expresses the difference in Fermi potential between the substrate and the intrinsic potential of this substrate. In this diagram, the threshold voltage $V_{t1}$ of the transistor $t_1$ has been taken as the reference. The curves a, b, c, respectively, represent the differences in threshold voltages of the transistors $t_2$ and $t_1$ when the width $Z_2$ of the transistor $t_2$ assumes the values $1\mu$, $2\mu$, $10\mu$, respectively, and the length $L_2$ of the channel of this transistor is greater than $30\mu$. In the same way, the curves d, e, f represent the differences in the threshold voltages of the transistors $t_3$ and $t_1$ as a function of the substrate-source voltage $V_{BS}$, when the length $L_3$ of the channel of the transistor $t_3$ assumes the values $10\mu$, $2\mu$, $1\mu$, respectively, and when the width $Z_3$ of the channel of this transistor is greater than $30\mu$. Obviously, it has been assumed that the transistor $t_1$ is a large transistor for which the length $L_1$ and the width $Z_1$ of the channel are greater than $30\mu$. It is obvious, in view of the above-mentioned equation which expresses the difference in threshold voltages between the transistors, that the curves shown in this diagram are straight lines passing through a common point, with the abscissa $-2\phi_F$.

A study of this diagram shows that the difference in threshold voltage is linear as a function of $Z^{-1}$ or $L^{-1}$, whilst Z here denotes the width $Z_2$ of the transistor $t_2$ and L denotes the length $L_3$ of the channel of the transistor $t_3$. In the technology of integrated circuits on a substrate, these geometric parameters can be defined with a very high degree of accuracy. The difference in threshold voltages, between the reference transistor and the transistor in question, is linear as a function of the substrate-source voltage $V_{BS}$. This difference is virtually independent of the temperature, as the only term in the abovementioned equation which introduces the temperature is the term $2\phi_F$; the variation of this term with the temperature can be regarded as negligible.

With reference to FIG. 4a, this shows, schematically, a circuit for measuring the threshold voltage of an MOS-type transistor $T_2$. This circuit comprises a capacitor C one terminal of which is connected to the source $S_2$ of the transistor and another terminal of which is connected to a point A common to the drain $D_2$ of the transistor $T_2$ and to the grid $G_2$ of this transistor. A switch $I_1$ controls the charging and discharging of the capacitor C; this switch is connected, on the one hand, to the common point A and, on the other hand, to a source of direct voltage $V_1$; it consists of an MOS transistor the drain, source and grid of which are marked 1, 2 and 3, respectively. The source $S_2$ of the MOS transistor $T_2$ is connected to regulating means (not shown) which enable the voltage $V_{BS2}$ between the substrate B of this transistor and its source $S_2$ to be fixed.

The method of operation of this circuit will be more easily understood with the help of diagrams A and B in FIG. 4b. Let us assume that the transistor $T_2$ is a small transistor, in one of its dimensions; the length of its channel, for example, is less than $5\mu$. When the switch $I_1$ is closed, i.e. when a control signal $\phi_1$ of duration $\Delta t$ is applied to the grid 3 of the charge and discharge control transistor $I_1$, the capacitor C becomes charged to the potential $V_1$ of the direct voltage source. After the time $\Delta t$, the switch $I_1$ is open, which corresponds to the blocking of the transistor $I_1$, the capacitor C discharges into the transistor $T_2$ until the voltage at its terminals is equal to the threshold voltage $T_{T2}$ of the transistor $T_2$. The grid and the drain of the transistor $T_2$ are connected and this means that the voltage at the terminals of the capacitor C controls the discharge current. This current is cancelled when the voltage $V_A - V_E$, i.e. the voltage between the drain $D_2$ of the transistor $T_2$ and the source $S_2$ of this transistor, reaches the threshold voltage $V_{T2}$ of the transistor $T_2$. The voltage $V_{D2} - V_{S2}$ between the drain and the source of the transistor $T_2$ is then equal to the threshold voltage $V_{T2}$ of the transistor $T_2$. This threshold voltage is controlled by the voltage $V_{BS2}$ applied at the common point E to an electrode of the capacitor C and to the source $S_2$ of the transistor $T_2$. In general, the threshold voltage $V_T$ may be measured by the voltage applied between the substrate and the source of this transistor after the circuit in FIG. 4a is put into operation. The small transistor $T_2$, the MOS transistor $I_1$ and the capacitor C may be made in the form of an integrated circuit on a semiconductor substrate. As will be seen hereinafter, this measuring circuit is applicable to the reference voltage generator according to the invention.

Figure 5:
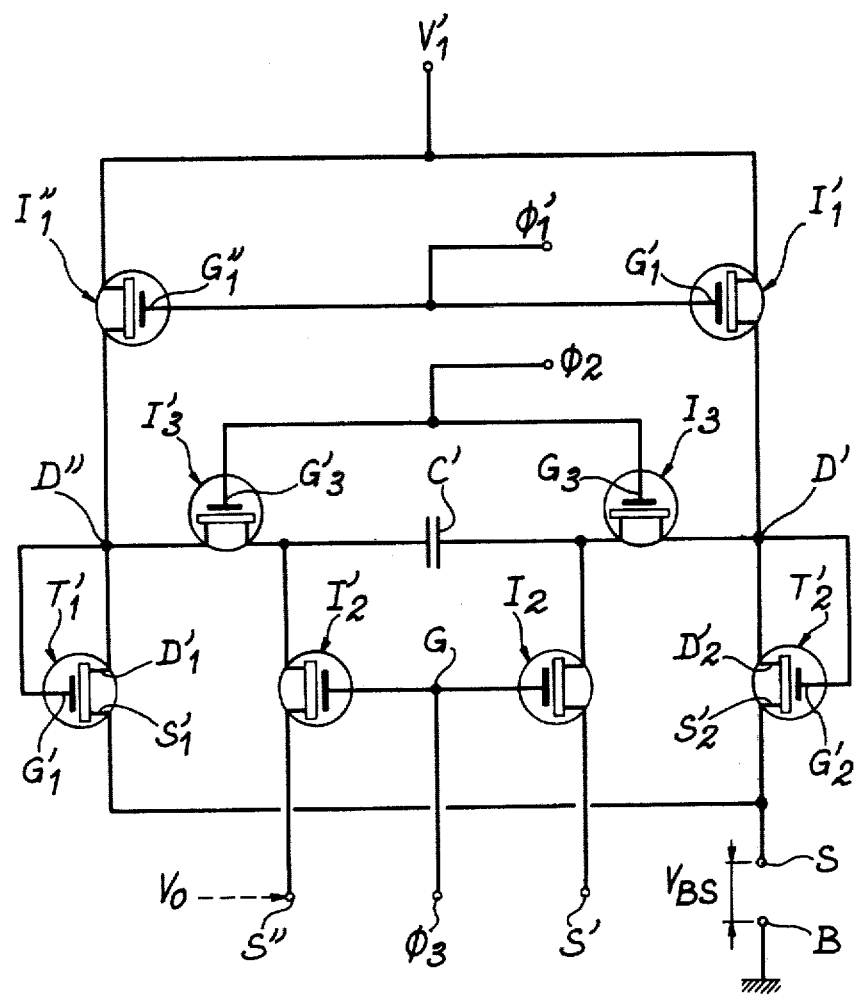
FIG. 5 schematically shows a reference voltage generator according to the invention.

With reference to FIG. 5, this schematically shows a reference voltage generator which comprises two MOS-type transistors $T'_1$ and $T'_2$ produced on the same substrate B. One of these transistors, such as $T'_2$, for example, is comparable with the transistor $T_2$ in FIG. 4a, which is small in dimensions; this transistor has a channel, only one dimension of which is of the same order of magnitude as the corresponding dimension of the extension, relative to the source $S'_2$ and the drain $D'_2$ of this transistor, of the space charge zone appearing round this source and this drain when the transistor is operating; the other dimension is large in relation to the corresponding dimension of this extension of the space charge zone; thus, for example, the transistor $T'_2$ has a channel length $L_2$ of less than $5\mu$; the transistor $T'_1$ is a large transistor and has a channel the two dimensions of which are large in relation to the corresponding dimensions of the extension, in relation to the source $S'_1$ and drain $D'_1$ of this transistor, of the space charge zone appearing round this source and this drain when the transistor is operating. Thus, for example, the length $L_1$ of the channel of the transistor $T'_1$ is greater than $30\mu$. As will be seen hereinafter, the reference generator according to the invention also comprises means for providing the difference between the threshold voltages of the transistors $T'_1$ and $T'_2$; this difference is representative of the reference voltage. The generator also comprises means (not shown) for fixing the common voltage $V_{BS}$ between the substrate on which the transistors $T'_1$ and $T'_2$ are formed, the sources $S'_1$ and $S'_2$ of these transistors being connected to a common point S.

The means for providing the difference in the threshold voltages of the transistors $T'_1$ and $T'_2$ comprise means for measuring the difference in the respective grid-source voltages of the transistors $T'_1$ and $T'_2$. These means comprise a capacitor C' the two terminals of which are respectively connected to a first point D', which is common to the grid $G'_2$ and to the drain $D'_2$ of the transistor $T'_2$, and to a second point D'', which is common to the grid $G'_1$ and drain $D'_1$ of the transistor T', via two switches $I_3$, $I_3'$ controlling the charging and discharging of the capacitor D'; these switches $I_3$ and $I_3'$ consist of MOS transistors which are identical to each other; the grids $G_3$ and $G_3'$ of these transistors are connected to each other and are capable of receiving switching control signals $\phi_2$; the drain and source of each of the transistors $I_3$ and $I_3'$ are connected, respectively, to the terminals of the capacitor C' and to the points D', D" which are common to the grids and drains of the transistors $T_1'$ and $T_2'$. The first and second common points D' and D" are connected to a direct voltage source $V_1'$, respectively, via two voltage-supplying switches $I_1'$ and $I_1''$. These switches consist of identical MOS transistors. Their grids $G_1'$ and $G_1''$ are connected to each other and can be connected to control means (not shown) so as to receive switching signals $\phi'_1$ enabling these transistors to be put into either the blocked state or the conducting state. The drains of these transistors are connected to the voltage source $V_1'$ whilst their sources are respectively connected to the first and second common points D' and D". As will be explained in detail hereinafter, the difference in the threshold voltages of the transistors $T_1'$ and $T_2'$ is obtained at the terminals of the capacitor C'. The reference voltage generator also comprises two output switches $I_2$ and $I_2'$ enabling this reference voltage to be recovered at the terminals of the capacitor C'. These output switches are made up of MOS transistors, the blocked and conducting states of which are controlled by switching signals $\phi_3$ applied to a common point G of this circuit and the capacitor C' is made in the form of an integrated circuit on a substrate.

The method of operation of the reference voltage generator shown in FIG. 5 will now be better understood from the following explanations. This generator puts into operation two threshold voltage measuring circuits, described above with reference to FIGS. 4a and 4b. The identical switches $I_3$ and $I_3'$ controlled by the switching signals $\phi_2$ enable the capacitor C' to be insulated from the other parts of the generator. The switches $I_1'$ and $I_1''$ controlled by the switching signals $\phi_1'$ enable the terminals of the capacitor C' to be precharged to the voltage $V_1'$, whilst the switches $I_2$ and $I_2'$, controlled by the switching signals $\phi_3$, enable the capacitor to be associated with the utilisation circuit which should be supplied with the reference voltage and which is connected between the electrodes S' and S" of the transistors which constitute the switches $I_2$ and $I_2'$. As mentioned above, the transistors $T_2'$ and $T_1'$ are of dimensions designed for a given difference in threshold voltages $V_{T2'} - V_{T1'}$. The reference voltage is thus obtained as follows:

(1) The switches $I_1'$, $I_1''$, $I_3$, $I_3'$ are closed, by applying switching signals $\phi_1'$, $\phi_2'$ to the grid of the corresponding transistors. The switches $I_2$ and $I_2'$ are assumed to be open during the time of closure of the switches $I_1'$, $I_1''$, $I_3$, $I_3'$. As a result, the plates of the capacitor C' become charged, thanks to the closure of these switches, and assume the potential $V_1'$ of the voltage source.

(2) The switches $I_3$ and $I_3'$ remain closed, whilst the switches $I_1'$, $I_1'$, $I_2$, $I_2'$ are open, thanks to the application of blocking signals $\phi_1'$, $\phi_3$ to the grids of the corresponding transistors. As a result, the capacitor C' discharges through the transistors $T_2'$ and $T_1'$; this discharging stops when the voltage $VD_1' - V_S$ between the grid and the source of the transistor $T_1'$ is equal to the threshold voltage $V_{T1'}$ of this transistor and the voltage $VD'_2 - V_S$ between the grid and the source of the transistor $T_2'$ is equal to the threshold voltage $V_{T2'}$ of this transistor. As a result, the difference in potential $VD_1' - VD_2'$ between the grids or the drains of the transistors $T_1'$ and $T_2'$ is equal to the difference in threshold voltage $V_{T1'} - V_{T2'}$ of the two transistors $T_1'$ and $T_2'$. This difference in threshold voltage is controlled by the voltage $V_{BS}$, applied between the substrate B on which the MOS transistors are formed, and the common point S of the sources $S_1'$ and $S_2'$ of the transistors $T_1'$ and $T_2'$.

(3) The switches $I_1'$, $I_1''$, $I_3$, $I_3'$ are then opened by applying control signals $\phi_1'$, $\phi_2$ to the corresponding transistors, whilst the switches $I_2$, $I_2'$ are closed, by applying a control signal $\phi_3$ to the grid of the corresponding transistors. The difference in threshold voltage $V_{T1'} - V_{T2'}$ is then available for the utilisation circuit connected between the terminals S' and S" of the switches $I_2$ and $I_2'$. This voltage remains stable when the ambient temperature varies. The utilisation circuit must at all costs have a very high input impedance. The difference in potential $V_{T1'} - V_{T2'}$ can be brought to any desired potential, for example by connecting the electrode S" to a polarisation potential $V_0$; the result is that, in relation to the substrate B, the point S' then has a potential equal to $V_0 + V_{T1'} - V_{T2'}$. In particular, the point S" may be brought to a potential $V_0$ representing a threshold voltage measured by a circuit such as that described with reference to FIG. 4a; the point S' can then be used to polarise an MOS transistor accurately.

The reference voltage generator described hereinbefore, which is produced in the form of an integrated circuit, can be used for supplying a wide variety of integrated circuits, and especially for supplying digital-to-analog or analog-to-digital converters which require a very stable reference voltage, to ensure that the results of the conversions are not erroneous. This reference voltage generator can also be used in microprocessors and in any system which can be connected to such microprocessors, or else in circuits for coding and decoding the spoken word in telecommunications.

The invention is not limited to the embodiments described and represented hereinbefore and various modifications can be made thereto without passing beyond the scope of the invention.

What is claimed is:

1. A reference voltage generator, characterised in that it comprises two MOS-type transistors $T_1'$ and $T_2'$ produced on the same substrate, the channels of these transistors having the respective lengths $L_1$ and $L_2$ and the respective widths $Z_1$ and $Z_2$, one of the transistors $T_2'$ having a channel, only one dimension of which is of the same order of magnitude as the corresponding dimension of the extension, relative to the source and drain of this transistor, of the space charge zone appearing round this source and this drain when the transistor is operating, the other dimension being large in relation to the corresponding dimension of said extension of the space charge zone, the other transistor $T_1'$ having a channel the two dimensions of which are large in relation to the corresponding dimensions of the extension, relative to the source and drain of this transistor, of the space charge zone appearing round this source and drain when the transistor is operating, and that it comprises means for providing the difference in the threshold voltages of the transistors $T_1'$ and $T_2'$, this difference in threshold voltages representing the reference voltage.

2. A reference voltage generator according to claim 1, comprising means for fixing the common substrate-source voltage of the transistors $T_1'$ and $T_2'$, the sources of which are connected to a common point.

3. A reference voltage generator according to claim 1, wherein the means for providing the difference in threshold voltages of the transistors $T_1'$ and $T_2'$ comprise means for measuring the difference in the respective grid-source voltages of the transistors $T_1'$ and $T_2'$.

4. A reference voltage generator according to claim 3, wherein the means for measuring the difference in the respective grid-source voltages of the transistors $T_1'$ and $T_2'$ comprise a capacitor the two terminals of which are respectively connected to a first point which is common to the grid and drain of the transistor $T_2'$ and to a second point which is common to the grid and drain of transistor $T_1'$, via two charging and discharging control switches, the first and second common points being connected to a direct voltage source, respectively via two voltage-supplying switches, so that when the two charge and discharge control switches and the two voltage-supplying switches are closed, each of the plates of the capacitor is charged to the potential of the source and so that, when the voltage-supplying switches are open and the charge and discharge control switches are closed, the plates of the capacitor discharge into the transistors $T_2'$ and $T_2'$, until the difference in potential available at the terminals of this capacitor is equal to the difference in threshold voltages of the transistors $T_1'$ and $T_2'$.

5. A reference voltage generator according to claim 4, wherein the difference in the threshold voltages of the transistors $T_2'$ and $T_1'$ is available at the terminals of the capacitor via two output switches, respectively, which are closed after the charge and discharge control switches are opened, when the difference in potential at the terminals of the capacitor is equal to the difference in threshold voltages of the transistors $T_2'$ and $T_1'$.

6. A reference voltage generator according to claim 5, wherein the charge and discharge switches, the voltage-supplying switches and the output switches are MOS transistors the grids of which are connected to means for making the charge and discharge control transistors and the voltage-supplying transistors conductive for a sufficient time to charge the plates of the capacitor to the potential of the source, then to block the voltage-supply transistors so that the plates of the capacitor discharge into the transistors $T_2'$ and $T_1'$, until the difference in potential at its terminals is equal to the difference in the threshold voltages of the transistors $T_2'$ and $T_1'$, then to make the output transistors conductive when this difference in threshold voltages is attained, this voltage being available between the sources of these output transistors whose drains are connected to the terminals of the capacitor, the drains of the transistors $T_2'$ and $T_1'$ being connected, respectively, to the drains of the charge and discharge transistors, whose sources are connected to said direct voltage source.

7. A reference voltage generator according to claim 6, wherein the source of one of the output transistors is connected to means for bringing this source to a predetermined polarisation potential in relation to the potential of the substrate of the transistors $T_2'$ and $T_1'$.

8. A reference voltage generator according to claim 7, wherein the length $L_1$ of the channel of $T_1'$ is greater than $30\mu$ and the length $L_2$ or the width $Z_2$ of the channel of $T_2'$ is less than $5\mu$.

9. A reference voltage generator according to claim 8, wherein the capacitor and the MOS transistors are produced in the form of an integrated circuit on a substrate.

* * * * *